(12) United States Patent
Nguyen et al.

(10) Patent No.: US 8,698,426 B1
(45) Date of Patent: Apr. 15, 2014

(54) SELF-POWERED CURRENT SENSING SWITCH WITH DIGITAL SETPOINT

(71) Applicant: Neilsen-Kuljian, Inc., San Jose, CA (US)

(72) Inventors: Huy D. Nguyen, Tracy, CA (US); Tom Lik-Chung Lee, San Jose, CA (US)

(73) Assignee: Neilsen-Kuljian, Inc., San Jose, CA (US)

( * ) Notice: Subject to any disclaimer, the term of this patent is extended or adjusted under 35 U.S.C. 154(b) by 0 days.

(21) Appl. No.: 14/073,811

(22) Filed: Nov. 6, 2013

(51) Int. Cl.
*H05B 37/02* (2006.01)

(52) U.S. Cl.
USPC .......... 315/307; 315/177; 315/209 R; 315/362

(58) Field of Classification Search
USPC .......... 315/129, 128, 127, 120, 121, 123, 135, 315/136, 177, 193, 200 R, 205, 209 R, 218, 315/224, 225, 226, 297, 307, 308, 313, 320, 315/361, 362
See application file for complete search history.

(56) References Cited

U.S. PATENT DOCUMENTS

| | | | |
|---|---|---|---|
| 6,690,952 B2 * | 2/2004 | Nishimori et al. | 455/562.1 |
| 2009/0284250 A1 * | 11/2009 | Rittmann | 324/130 |
| 2013/0231793 A1 * | 9/2013 | Elliott et al. | 700/292 |

* cited by examiner

*Primary Examiner* — Douglas W Owens
*Assistant Examiner* — Jianzi Chen
(74) *Attorney, Agent, or Firm* — TIPS Group

(57) ABSTRACT

An apparatus for setting a digital setpoint for a self-powered current sensing switch includes a current transformer, a digital processor and a parallel converter for converting the AC output of the current transformer to a DC power source for the digital processor along a first path and into a digital signal which is input to the digital processor along a second path. The apparatus also includes a manually operated switch coupled to the digital processor and having a calibration mode position, code segments executing on the digital processor to convert the digital signal to a digital setpoint value when the manually operated switch is in the calibration mode position, and non-volatile memory for storing the digital setpoint value.

18 Claims, 8 Drawing Sheets

SELF-POWERED CURRENT SENSING SWITCH WITH DIGITAL SETPOINT

BACKGROUND

A current sensor is a device that detects electrical current in a conductor and generates a signal proportional to the detected current. One type of current sensor suitable for the detection of alternating current (A/C) flowing in a conductor is known as a "current transformer." A typical current transformer includes a split ring made of ferrite or soft iron with a wire coil wound around one or both halves, forming one winding of the current transformer, where the conductor carrying the electrical current being detected forms the other "winding."

A current sensing switch or relay combines a current sensor with logic circuitry which controls a switch based upon a comparison between the generated signal and a threshold (a.k.a. "trigger" and "trip point") level. When the threshold level can be manually adjusted, it is sometimes referred to as a "setpoint" because it has been set by, or on behalf of, the user. Current sensing switches can react to overload conditions and/or underload conditions, depending upon the type.

Traditional logic circuitry for current sensing switches tends to be analog in nature. Typically, a trimming potentiometer ("trim pot") is used to adjust the setpoint to a desired level. While such circuitry is inexpensive it suffers from a lack of accuracy in that the trim pot tends to be only accurate in the ±20% range.

More sophisticated current sensing switches may use digital logic circuitry, such as a microcontroller, to provide more flexibility and accuracy with respect to setpoint settings. For example, the ASM Series Self-calibrating Smart-Relay of NK Technologies of San Jose, Calif. ("NKT Smart-Relay") uses an actual load current as detected by a current transformer to set one or more trip points which are stored in digital memory. After a few seconds of steady running conditions, the NKT Smart-Relay's microcontroller locks onto the "normal" current level, after which automatically establishes trip points at 85% of the normal current level (for underload conditions) and 125% of normal current level (for overload conditions). The NKT Smart-Relay is self-powered by drawing power from its current transformer.

While current sensing switches such as the NKT Smart-Relay are flexible and useful for many applications, they are not well adapted to accurately setting specific setpoints. For example, the NKT Smart-Relay depends upon initial steady running conditions to automatically set trips points 25% above 15% below the "normal" current level. Since the "normal" current level can fluctuate, this can cause undesirable and unpredictable variances in the trip point levels and automatically builds in a large tolerance to a desired trip point. It is therefore difficult to accurately set specific setpoints values with conventional current sensing switches.

SUMMARY

In an embodiment, set forth by way of example and not limitation, a self-powered current sensing switch with digital setpoint includes: a current transformer operative to develop an alternating current (AC) output; an alternating-current-to-direct-current (AC/DC) converter having an input coupled to the AC output of the current transformer and having a direct current (DC) output; an analog-to-digital (A/D) converter coupled to the AC output of the current transformer; a digital processor powered by the DC output of the AC/DC converter and having an input coupled to an output of the A/D converter; an electrically controlled output switch coupled to an output of the digital processor; a manually controlled input switch coupled to the digital processor and having a switch mode position and a calibration mode position; and digital memory coupled to the digital processor including code segments executable on the digital processor.

In an embodiment, set forth by way of example but not limitation, code segments of a self-powered current sensing switch with digital setpoint implements the processes of: (a) performing initialization routines in response to the powering-up of the digital processor by the AC/DC converter; (b) operating in a switch mode which is operative to electrically control the output switch based upon a stored digital setpoint when the manually controlled input switch is in the switch mode position; and (c) operating in a calibration mode by storing a digital setpoint corresponding to a setpoint current detected by the current transformer when the manually controlled input switch is in the calibration mode position.

In an embodiment, set forth by way of example and not limitation, a method for setting a digital setpoint for a self-powered current sensing switch includes: flowing a setpoint current through a conductor to generate a varying magnetic field; developing an analog current (AC) signal from the varying magnetic field; converting, in parallel, the AC signal to a direct current (DC) power source for a digital processor and to a digital signal which is coupled to inputs of the digital processor; detecting, by the digital processor, a calibration mode from a manually operated input switch; calculating, on the digital processor, a digital setpoint value from the digital signal; and storing, by the digital processor, the digital setpoint value in non-volatile memory.

In an embodiment, set forth by way of example and not limitation, an apparatus for setting a digital setpoint for a self-powered current sensing switch includes: a current transformer for developing an analog current (AC) signal from a varying magnetic field produced by a setpoint current flowing through a conductor; a digital processor; parallel converter means for converting the AC signal to a direct current (DC) power source for the digital processor and to a digital signal which is coupled to inputs of the digital processor; a manually operated switch coupled to the digital processor and having a switch mode position; calculating means converting the digital signal to a digital setpoint value when the manually operated switch is in the switch mode; and non-volatile memory for storing the digital setpoint value.

An advantage of certain example embodiments is that a setpoint can be very accurately set by manually entering a calibration mode for a current sensing switch, passing a known current through a conductor in proximity to a current transformer, and developing a precise digital setpoint from the measure current.

An advantage of certain example embodiments is that a digital setpoint may be selected which can be, by way of non-limiting example, accurate to within 1-2 percent of a desired setpoint.

Another advantage of certain example embodiments is that the current sensing switch powers a digital process by the same output signal of the current transformer that is used to provide a digital input to the digital processor.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
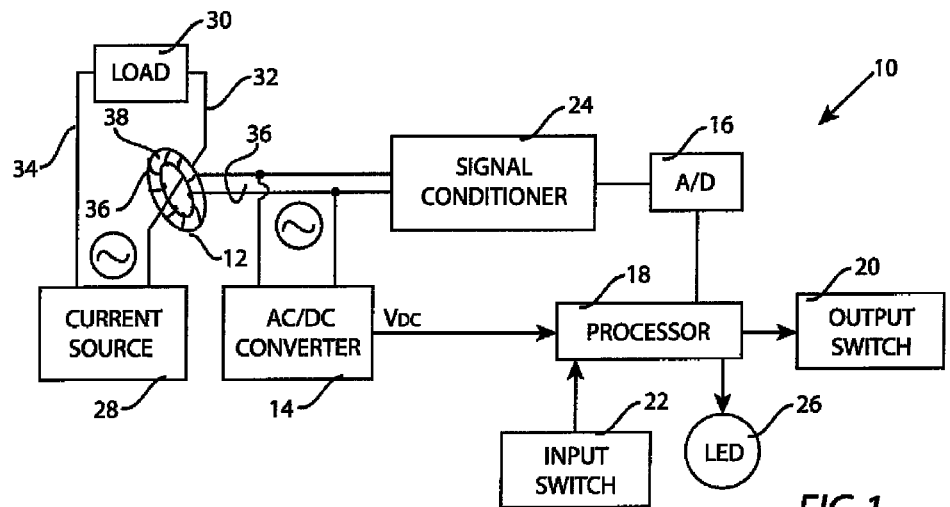
FIG. 1 is a block diagram of an example self-powered current sensing switch with digital setpoint.

FIG. 1 is a block diagram illustrating, by way of example and not limitation, a self-powered current sensing switch with digital setpoint 10 including a current transformer 12, an alternating-current-to-direct-current (AC/DC) converter 14, an analog-to-digital (A/D) converter 16, a digital processor 18, an electrically controlled output switch 20, an manually controlled input switch 22, a signal conditioner 24, and an output indicator 26. A current source 28 is coupled to a load 30 by wires 32 and 34, where wire 32 is adjacent to the current transformer 12.

The current transformer 12 can, by way of non-limiting example, include an induction coil comprising a wire 36 wrapped around a core 38. The design and manufacture of current transformers are well known to those of skill in the art. For example, in U.S. Pat. No. 6,566,855 of Nguyen et al., the disclosure of which is incorporated herein by reference, a device to measure current magnitude in a conductor coupled to an electrical device is disclosed. It will be appreciated by those of skill in the art that a current transformer is just one type of current sensor and that other types of sensors, such as Hall-Effect sensors, can also be used to measure current.

In this example, current source 28 provides alternating current (AC) power to load 30. AC current flowing through wire 32 creates a varying magnetic field which induces an AC output on the wire 36 that is wound around the core 38. This AC output is split into two parallel paths, namely a first path to the AC/DC converter 14 and a second path to the A/D converter 16 via, in this non-limiting example, the signal conditioner 24 which may include filters, amplifiers, etc. In alternate embodiments, the signal conditioner 24 may be omitted, in whole or in part. The A/D converter is coupled to one or more inputs of the processor 18. The AC/DC converter 14 has a direct current (DC) output $V_{DC}$ which is used to provide power to the processor 18.

The output switch 20 is an electrically controlled switch. In certain embodiments, output switch can be an electrical or electronic device such as, by way of non-limiting examples, a power metal oxide field effect transistor (MOSFET), a silicon controlled rectifier (SCR) or an electromagnetic relay. It can be implemented as a single-pole-single-throw (SPST) switch a single-pole-double-throw (SPDT) switch, and as other types of switches as will be appreciated by those of skill in the art. Also, the output switch 20 can be partially or fully normally open and/or normally closed. Typical uses, set forth by way of example and not limitation, for output switch 20 are to serve as a circuit breaker, to sound an alarm, etc. The output switch is coupled to one or more outputs of processor 18. In certain example embodiments the output switch 20 can be directly coupled to one or more I/O leads of processor 18 and in certain alternative embodiments the output switch 20 can be coupled to processor 18 by buffers, registers, drivers, etc.

The input switch 22 is manually controlled an, in the present non-limiting example, includes a switch mode position and a calibration mode position. The input switch 22 is coupled to an input of the processor 18. The current sensing switch 10, in this example, therefore has two operating modes: a switch mode wherein the current sensing switch 10 operates in its normal fashion and a calibration mode wherein a digital setpoint is calculated by the processor 18 and stored in digital memory (sometimes referred to as "non-transitory computer readable media").

The output indicator 26 is, in this example, a light-emitting diode (LED) coupled to an output of processor 18. The LED 26 of this example may be directly coupled to an I/O pin of the processor 18, or may be coupled to processor 18 by buffers, registers, drivers, etc. A purpose of the output indication, in certain example embodiments, is to provide status information concerning the operation of the current sensing switch 10.

Figure 1A:
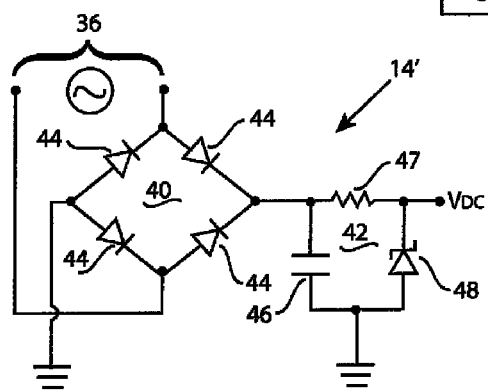
FIG. 1A is a schematic diagram of an example AC/DC converter.

FIG. 1A is a schematic, set forth by way of example and not limitation, of an AC/DC converter 14'. In this example, the AC/DC converter 14' includes a rectification stage 40 and a filter stage 42. By way of non-limiting example, the rectification stage 40 can comprise four diodes 44 arranged as a bridge rectifier and the filter stage 42 comprises a capacitor 46 and resistor 47 arranged as an RC filter. Optionally, a regulator, such as Zener diode 48, can be provided at the output of the RC filter. As will be appreciated by those of skill in the art, in certain embodiments other rectification and filter stages can be used or, for example, the filter stage 42 may be omitted.

Figure 2:
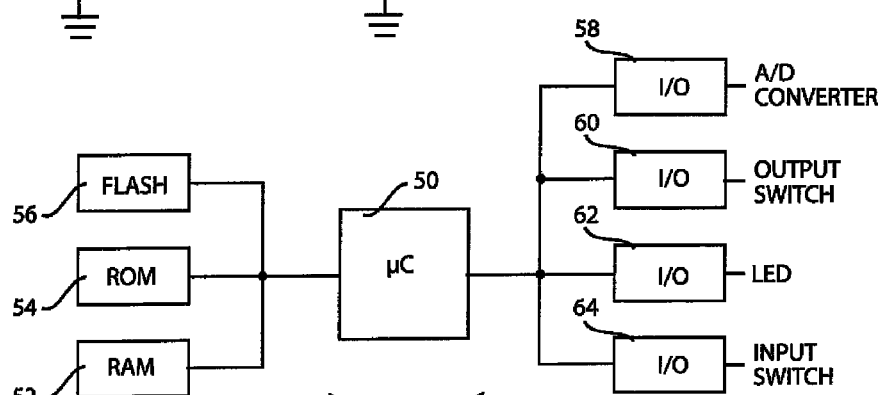
FIG. 2 is a block diagram of an example processor of FIG. 1.

FIG. 2 is a block diagram of an example processor 18' including a microcontroller (μC) 50, random access memory (RAM) 52, read-only memory (ROM) 54, flash memory 56, I/O 58 coupled to A/D converter 16, I/O 60 coupled to output switch 20, I/O 62 coupled to LED 26, and I/O 64 coupled to input switch 22 (see also, FIG. 1). The types and number of memory and I/O circuits are set forth by way of example and not limitation, as will be appreciated by those of ordinary skill in the art. Furthermore, the I/O may, in some example embodiments, be I/O leads or "pins" of μC 50 and, in other example embodiments, may be registers, drivers, etc.

Microcontroller 50 of FIG. 2 is illustrated, by way of example and not limitation, as a type of microprocessor or microcontroller that is available from a number of sources. For example, an 8-pin flash microcontroller from Microchip Technology, Inc., part number PIC12(L)F1840 has been found to be suitable. As will be appreciated by those of skill in the art, however, other forms of microcontroller 50 are also suitable for certain applications. Also, instead of using a microcontroller or microprocessor, functionality of processor 18 may be implemented as a state machine, in discrete logic, or otherwise. As noted, in the example of FIG. 2, the processor 18' includes digital memory (e.g. memories 52, 54, 56) that can include code segments (sometimes referred to as machine code) that are executable on the μC 50.

Figure 3:
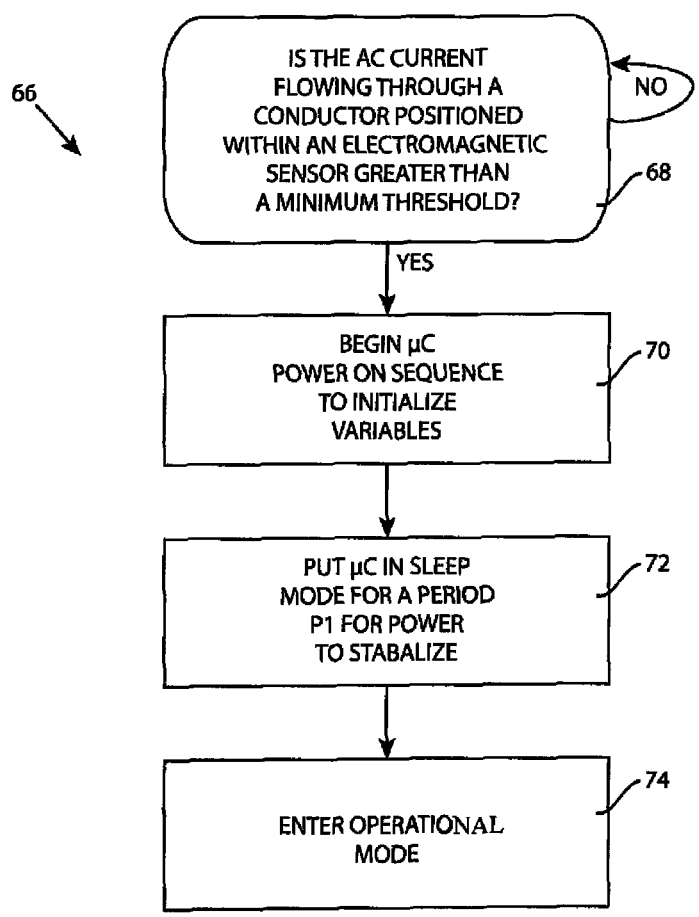
FIG. 3 is a flow diagram of an example operation of the current sensing switch of FIG. 1.

FIG. 3 is a flow diagram of an example operating process 66 of the current sensing switch 10 of FIG. 1. Process 66 begins at 68 wherein the process idles until an AC current flowing through conductor 32 is greater than a minimum threshold. For example, the minimum threshold may be the level whereby the current transformer 12 develops a sufficient current for the AC/DC converter to produce $V_{DC}$ at a sufficient level to power-up processor 18. By way of non-limiting example, a two ampere (A) current through wire 32 may produce a sufficient AC output on wire 36 for the AC/DC converter 14 to produce a $V_{DC}$ in the 3-5 volt range.

After the condition set forth in operation 68 is met, an operation 70 begins a power-on sequence to, for example, initialized variables, set parameters and constants, etc. This is preferably implemented by μC 50 by evoking a power-up sequence which goes to a predetermined address in memory (e.g. ROM 54) which begins a series of instructions ("code segments") to initialize the system. After the power-on sequence of operation has completed, an optional operation 72 puts the μC 50 into a "sleep mode" for a period of time P1 (e.g. 1 second) to allow the power produced by the AC/DC converter 14 to stabilize. After the period of time P1 the μC 50 is "woken up" and begins and ENTER OPERATIONAL MODE process 74.

Figure 4:
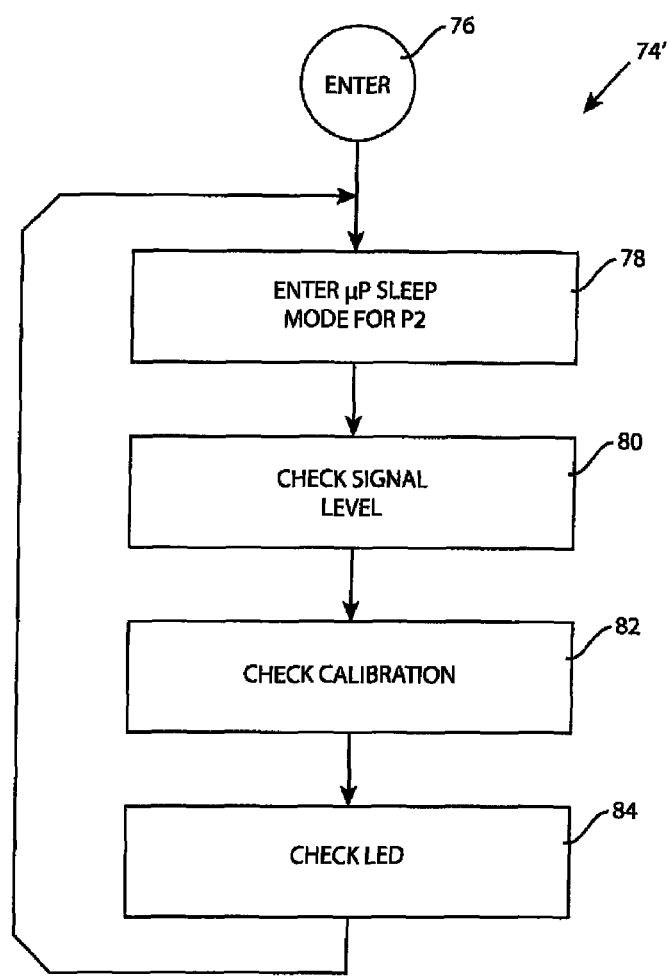
FIG. 4 is a flow diagram of an example ENTER OPERATIONAL MODE process of FIG. 3.

FIG. 4 is a flow diagram of an example ENTER OPERATIONAL MODE process 74'. In this embodiment, set forth by way of example and not limitation, process 74' begins at 76 and, in an operation 78, the μC 50 enters a sleep mode for a period of time P2 (e.g. 32 milliseconds). Next, in a CHECK SIGNAL LEVEL process 80, the signal level of the AC output of the current transformer is checked. Then, in a CHECK CALIBRATION process 82, it is checked to see if a calibration process (e.g. to set one or more digital setpoints), is in progress. Finally, in a CHECK LED process 84, the control of the LED 26 is implemented.

Figure 5:
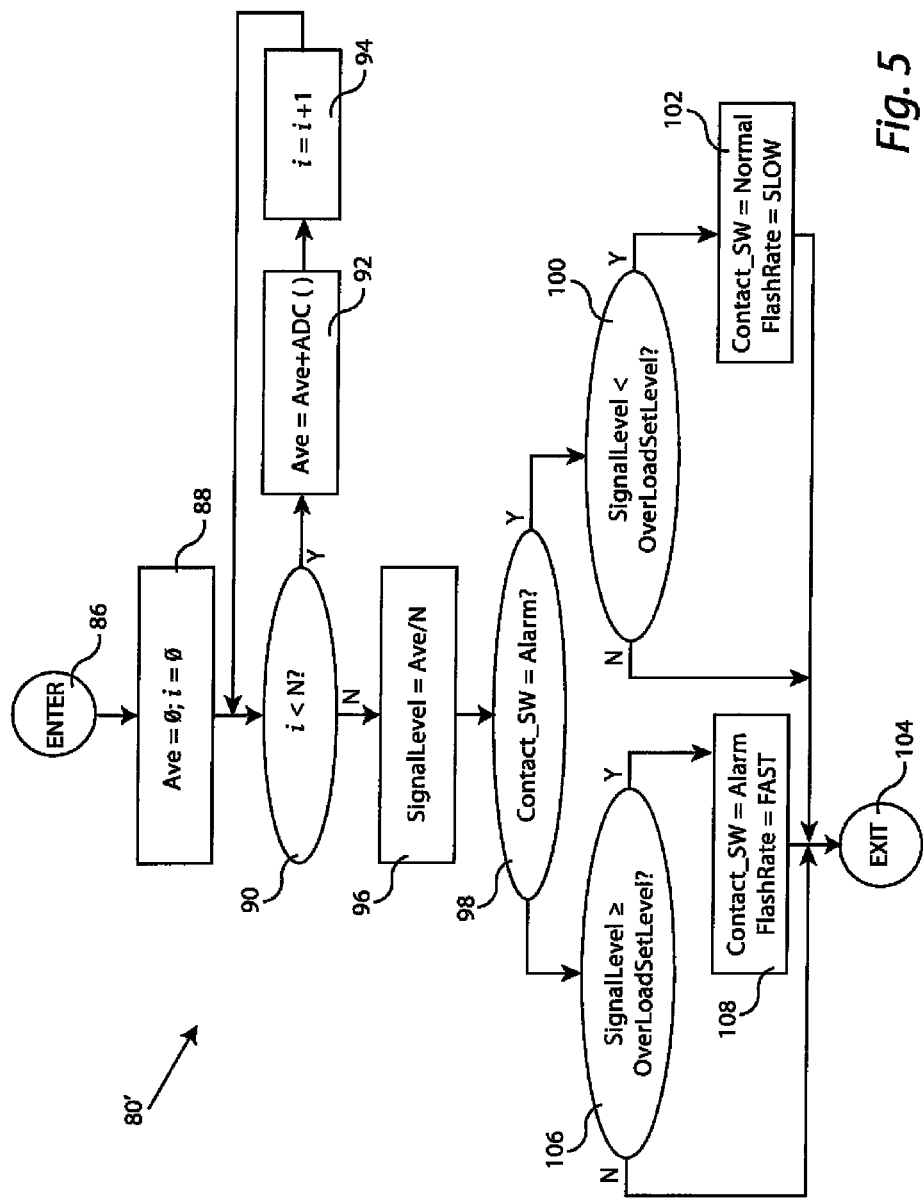
FIG. 5 is a flow diagram of an example CHECK SIGNAL LEVEL process of FIG. 4.

FIG. 5 is a flow diagram of an example CHECK SIGNAL LEVEL process 80' of FIG. 4. The process 80' is started at 86 and, in an operation 88, the variable Ave and the counter "i" are initialized to zero. A decision operation 90 determines if the counter i is less than N, the number of samples that are to be taken of the digitized AC output (by the A/D converter 16) of the current transformer 12. If i is less than N, then the variable Ave is incremented by the amplitude ADC( ) of the digitized AC output of the current transformer 12 at the $i^{th}$ sample point in an operation 92. The counter i is incremented by one in operation 94, and process control is returned to operation 90 to continue the loop until i=N, at which time an operation 96 calculates the signal level as SignalLevel=Ave/N.

Next, in an operation 98, it is determined if the variable Contact_SW=Alarm. If so, an operation 100 determines if SignalLevel<OverLoadResetLevel. If so, an operation sets Contact_SW=Normal and FlashRate=SLOW. If not, the process 80' exits at 104. If operation 98 determines that the variable Contact_SW≠Alarm, then an operation 106 determines if SignalLevel≥OverLoadSetLevel. If so, operation 108 sets Contact_SW=Alarm and FlashRate=FAST before exiting process 80' at 104. If not, then the process 80' is directly exited at 104.

Figure 6:
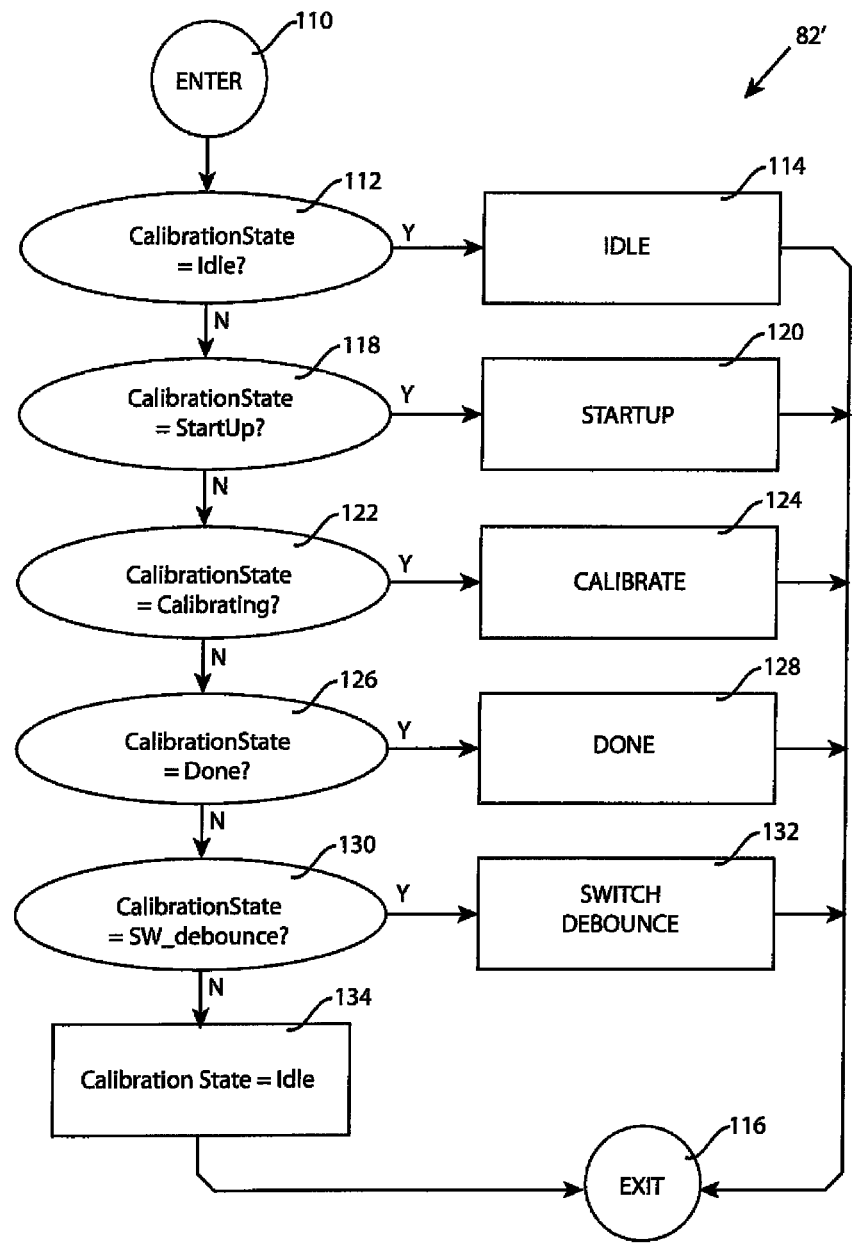
FIG. 6 is a flow diagram of an example CHECK CALIBRATION process of FIG. 4.

FIG. 6 is a flow diagram of an example CHECK CALIBRATION process 82' of FIG. 4. The process 82' starts at 110 and, in an operation 112, it is determined if the variable CalibrationState=Idle. If so, an IDLE process 114 is implemented and the process 82' subsequently exits at 116. If not, an operation 118 determines if CalibrationState=Startup. If so, a STARTUP process 120 is implemented and the process 82' subsequently exits at 116. If not, an operation 122 determines if CalibrationState=Calibrating. If so, a CALIBRATE process 124 is implemented and the process 82' subsequently exits at 116. If not, an operation 126 determines if CalibrationState=Done. If so, a DONE process 128 is implemented and the process 82' subsequently exits at 116. If not, an operation 130 determines if CalibrationState=SW_debounce. If so, a SWITCH DEBOUNCE process 132 is implements and the process 82 subsequently exits at 116. If not, an operation 134 sets CalibratingState=Idle, e.g. as a default condition and the process 82 subsequently exits at 116.

Figure 7:
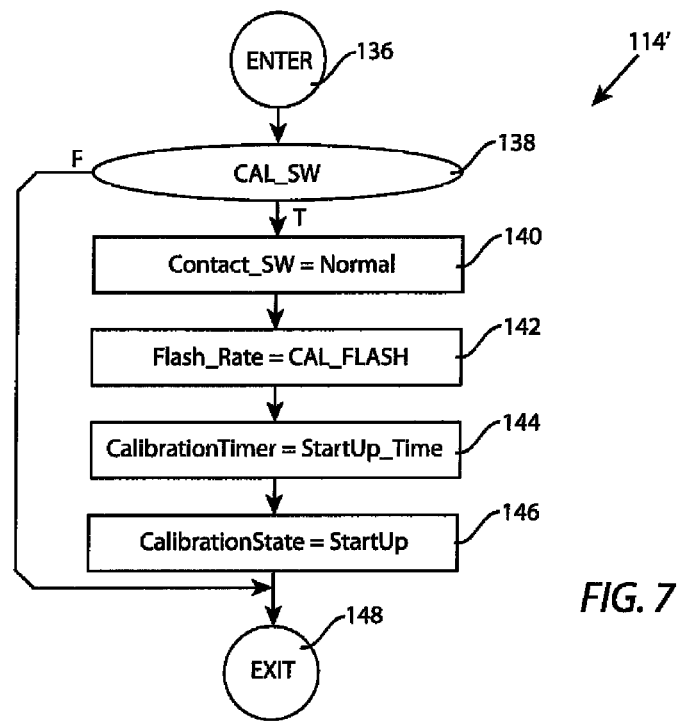
FIG. 7 is a flow diagram of an example IDLE process of FIG. 6.

FIG. 7 is a flow diagram of an example IDLE process 114' of FIG. 6. The process 114' starts at 136 and, in an operation 138 it is determined if the flag CAL_SW is true or false. If true, an operation 140 sets the variable Contact_SW=Normal, an operation 142 sets the variable Flash_Rate=CAL_FLASH, an operation 144 sets the variable CalibrationTimer=StartUp_Time, and an operation 146 sets the variable CalibrationState=StartUp, before the process 114' exits at 148. If CAL_SW is false, the process 114' simply exits at 148.

Figure 8:
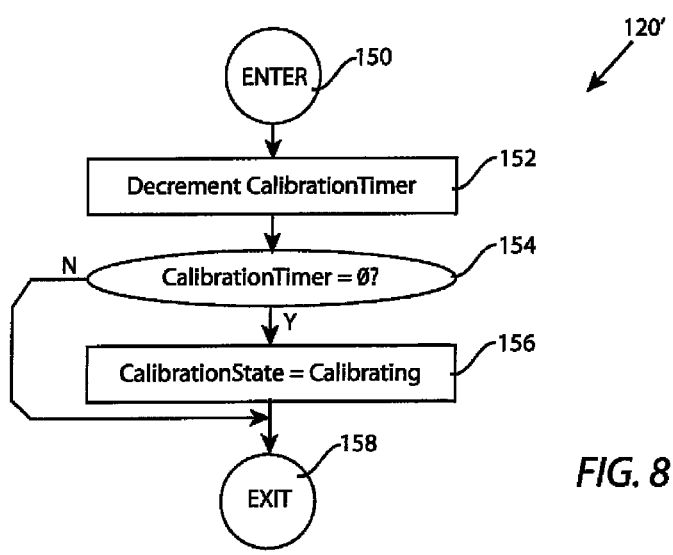
FIG. 8 is a flow diagram of an example STARTUP process of FIG. 6.

FIG. 8 is a flow diagram of an example STARTUP process 120' of FIG. 6. The process 120 begins at 150 and, in an operation 152, the variable CalibrationTimer is read from digital memory and decremented. Next, in an operation 154, it is determined if CalibrationTimer=0. If so, operation 156 sets CalibrationState=Calibrating before process 120' exits at 158. If not, the process 120' exits directly at 158.

Figure 9:
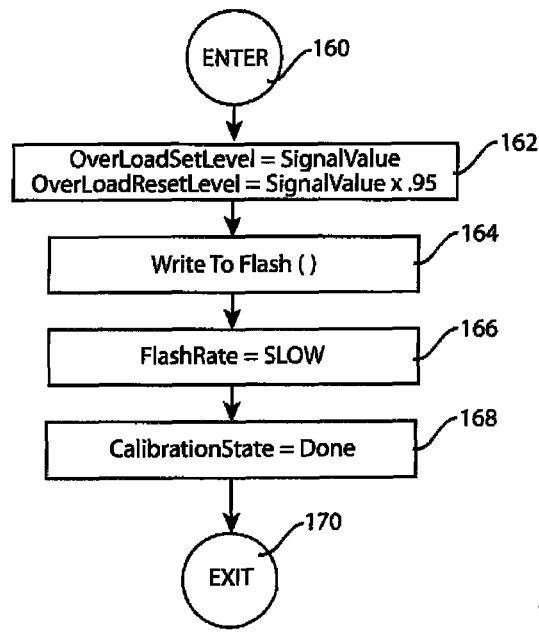
FIG. 9 is a flow diagram of an example CALIBRATE process of FIG. 6.

FIG. 9 is a flow diagram of an example CALIBRATE process 124' of FIG. 6. The example process 124' begins at 160 and an operation 162 sets the variable OverLoadSetLevel=SignalValue and the variable OverLoadResetLevel=SignalValue*0.95. That is, the OverLoadSetLevel variable is set to 100% of SignalValue and the OverLoadResetLevel is set to 95% of SignalValue, in this non-limiting example. Next, in an operation 164, the variables are written, for example, to flash memory 56. Then, an operation 166 sets the variable FlashRate=SLOW and an operation 168 sets the flag CalibrationState=Done before exiting process 124' at 170.

Figure 10:
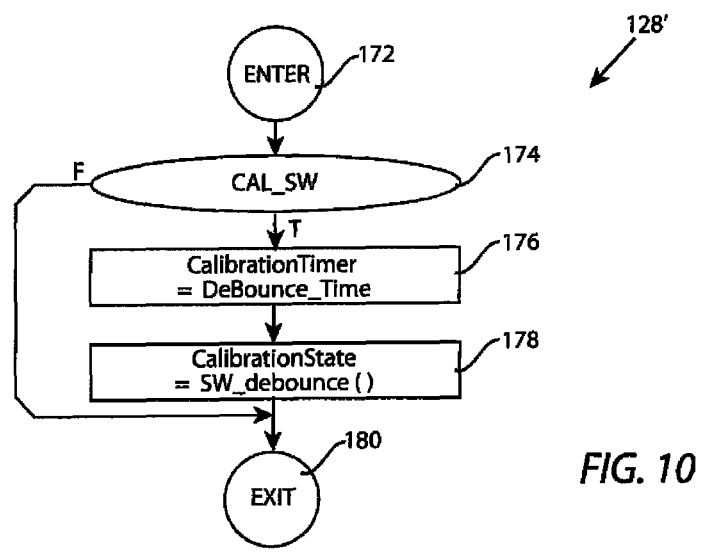
FIG. 10 is a flow diagram of an example DONE process of FIG. 6.

FIG. 10 is a flow diagram of an example DONE process 128' of FIG. 6. The process 128 begins at 172 and, in an operation 174, it is determined if the flag CAL_SW is true or false. Next, an operation 174 sets variable CalibrationTimer=DeBounce_Time and an operation 176 sets variable CalibrationState=SW_debounce( ) before exiting at 180.

Figure 11:
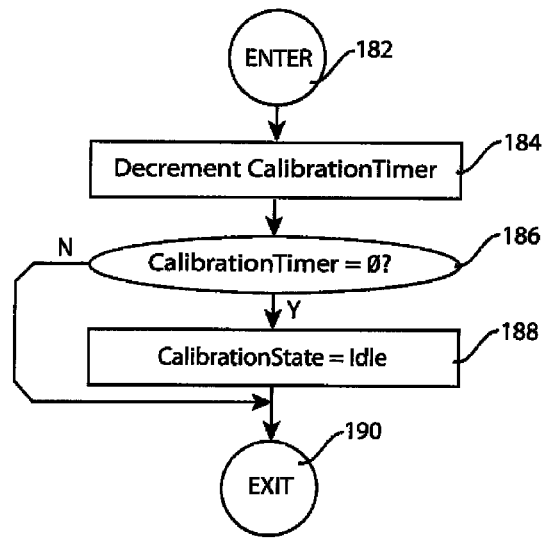
FIG. 11 is a flow diagram of an example SWITCH DEBOUNCE process of FIG. 6.

FIG. 11 is a flow diagram of an example SWITCH DEBOUNCE process 132' of FIG. 6. The process 132' begins at 182 and, in an operation 184, the variable CalibrationTimer is read from digital memory and decremented. Next, in an operation 186, it is determined if CalibrationTimer=0 and, if so, an operation 188 sets the flag CalibrationState=Idle before process 132' exits at 190. If not, the process 132' directly exits at 190.

Figure 12:
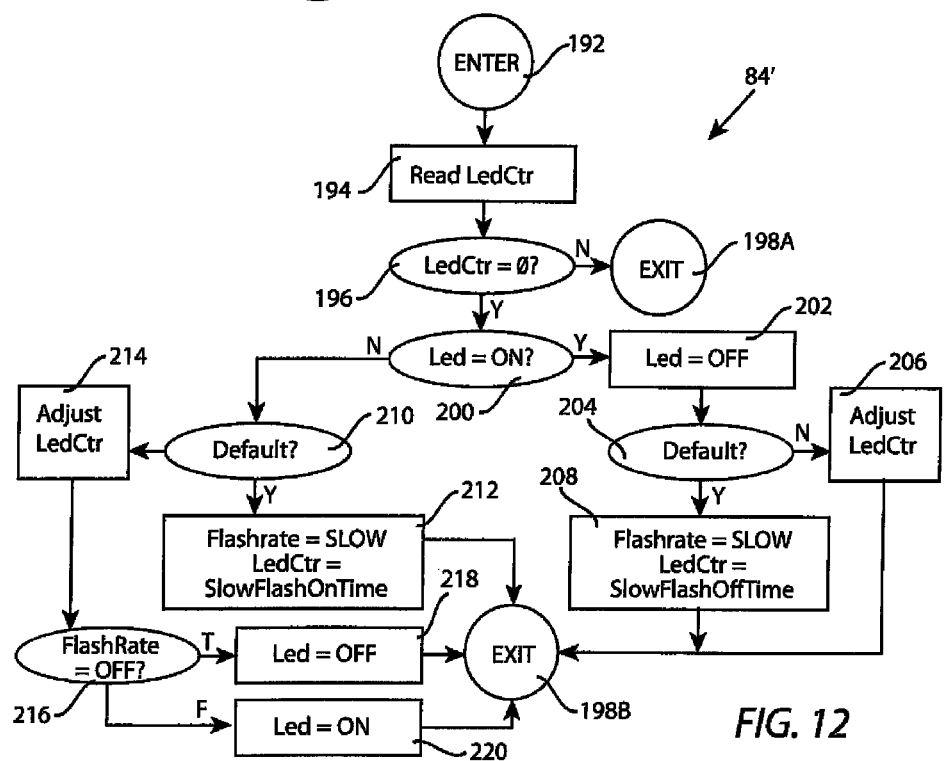
FIG. 12 is a flow diagram of an example CHECK LED process of FIG. 4.

FIG. 12 is a flow diagram of an example CHECK LED process 84' of FIG. 4. Process 84' begins at 192 and, in an operation 194, the variable LedCtr is read from digital memory. Next, in an operation 196, if it is determined that LedCtr≠0, the process 84' exits at 198A. If operation 196 determines that LedCtr=0, then an operation 200 determines if the flag Led=ON. If so, an operation 200 sets the flag Led=OFF and it is determined in an operation 204 whether default values should be assigned. If not, an operation 206 adjusts the variable LedCtr before process 84' exits at 198B. If so, operation 208 assigns variable Flashrate=SLOW and variable LedCtr=SlowFlashOffTime before operation 84' exits at 198B. If operation 200 determines that LedCtr≠0 then an operation 210 determines whether default values should be assigned. If so, operation 212 sets variable FlashRate=SLOW and variable LedCtr=SlowFlashOnTime before exiting at 198B. If not, then an operation 214 adjusts the LedCtr variable and an operation 216 determines if the flag FlashRate=OFF. If true, operation 218 sets flag Led=OFF, and if false operation 220 sets flag Led=ON, before exiting at 198B.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A self-powered current sensing switch with digital setpoint comprising:
    a current transformer operative to develop an alternating current (AC) output;
    an alternating-current-to-direct-current (AC/DC) converter having an input coupled to the AC output of the current transformer and having a direct current (DC) output;
    an analog-to-digital (A/D) converter coupled to the AC output of the current transformer;
    a digital processor powered by the DC output of the AC/DC converter and having an input coupled to an output of the A/D converter;
    an electrically controlled output switch coupled to an output of the digital processor;
    a manually controlled input switch coupled to the digital processor and having a switch mode position and a calibration mode position; and
    digital memory coupled to the digital processor including code segments executable on the digital processor for:
      a) performing initialization routines in response to the powering-up of the digital processor by the AC/DC converter;
      b) operating in a switch mode which is operative to electrically control the output switch based upon a stored digital setpoint when the manually controlled input switch is in the switch mode position; and
      c) operating in a calibration mode by storing a digital setpoint corresponding to a setpoint current detected by the current transformer when the manually controlled input switch is in the calibration mode position.

2. A self-powered current sensing switch with digital setpoint as recited in claim 1 wherein the AC/DC converter includes at least one solid-state rectifier.

3. A self-powered current sensing switch with digital setpoint as recited in claim 2 further comprising a signal conditioner coupling the A/D converter to the current transformer.

4. A self-powered current sensing switch with digital setpoint as recited in claim 3 further comprising an output indicator coupled to the digital processor.

5. A self-powered current sensing switch with digital setpoint as recited in claim 4 wherein the output indicator is a light emitting diode (LED).

6. A self-powered current sensing switch with digital setpoint as recited in claim 4 wherein the AC/DC converter includes a bridge rectifier circuit.

7. A self-powered current sensing switch with digital setpoint as recited in claim 6 wherein the AC/DC converter includes a filter circuit.

8. A self-powered current sensing switch with digital setpoint as recited in claim 4 wherein the digital memory includes read/write memory and wherein the setpoint is stored in the read/write memory.

9. A method for setting a digital setpoint for a self-powered current sensing switch comprising:
    flowing a setpoint current through a conductor to generate a varying magnetic field;
    developing an analog current (AC) signal from the varying magnetic field;
    converting, in parallel, the AC signal to a direct current (DC) power source for a digital processor and to a digital signal which is coupled to inputs of the digital processor;
    detecting, by the digital processor, a calibration mode from a manually operated input switch;
    calculating, on the digital processor, a digital setpoint value from the digital signal; and
    storing, by the digital processor, the digital setpoint value in non-volatile memory.

10. A method for setting a digital setpoint for a self-powered current sensing switch as recited in claim 9 wherein the AC signal is developed by a current transformer.

11. A method for setting a digital setpoint for a self-powered current sensing switch as recited in claim 10 wherein the AC signal is converted to a DC power source by an alternating-current-to-direct-current (AC/DC) converter.

12. A method for setting a digital setpoint for a self-powered current sensing switch as recited in claim 11 wherein AC signal is converted to a digital signal by an analog-to-digital (A/D) converter.

13. A method for setting a digital setpoint for a self-powered current sensing switch as recited in claim 12 wherein calculating the digital setpoint value comprises calculating a root-mean-square (RMS) value of the setpoint current from the digital signal.

14. An apparatus for setting a digital setpoint for a self-powered current sensing switch comprising:
    a current transformer for developing an analog current (AC) signal from a varying magnetic field produced by a setpoint current flowing through a conductor;
    a digital processor;
    parallel converter means for converting the AC signal to a direct current (DC) power source for the digital processor and to a digital signal which is coupled to inputs of the digital processor;
    a manually operated switch coupled to the digital processor and having a calibration mode position;
    calculating means converting the digital signal to a digital setpoint value when the manually operated switch is in the calibration mode position; and
    non-volatile memory for storing the digital setpoint value.

15. A method for setting a digital setpoint for a self-powered current sensing switch as recited in claim 14 wherein the current transformer means comprises a split ring of a ferromagnetic material and a wire coil wound around at least a portion of the split ring.

16. A method for setting a digital setpoint for a self-powered current sensing switch as recited in claim 15 wherein the parallel converter means includes an alternating-current-to-direct-current (AC/DC) converter.

17. A method for setting a digital setpoint for a self-powered current sensing switch as recited in claim 16 wherein the parallel converter means includes an analog-to-digital (A/D) converter.

18. A method for setting a digital setpoint for a self-powered current sensing switch as recited in claim 17 wherein the calculating means includes code segments executing on the digital processor which calculate a root-mean-square (RMS) value of the setpoint current from the digital signal.

* * * * *